(12) United States Patent
Kim et al.

(10) Patent No.: US 7,310,387 B2
(45) Date of Patent: Dec. 18, 2007

(54) APPARATUS FOR COMPENSATING DC OFFSETS, GAIN AND PHASE IMBALANCES BETWEEN I-CHANNEL AND Q-CHANNEL IN QUADRATURE TRANSCEIVING SYSTEM

(75) Inventors: PanSoo Kim, Daejon (KR); Ho-Jin Lee, Daejon (KR)

(73) Assignee: Electronics and Telecommunications Research Institute (KR)

( * ) Notice: Subject to any disclaimer, the term of this patent is extended or adjusted under 35 U.S.C. 154(b) by 373 days.

(21) Appl. No.: 10/955,759

(22) Filed: Sep. 29, 2004

(65) Prior Publication Data
US 2005/0157815 A1 Jul. 21, 2005

(30) Foreign Application Priority Data
Dec. 26, 2003 (KR) ............... 10-2003-0097849
Jun. 30, 2004 (KR) ............... 10-2004-0050413

(51) Int. Cl.
*H04L 27/00* (2006.01)
*H04L 27/08* (2006.01)
*H04L 27/22* (2006.01)
*H04L 27/06* (2006.01)

(52) U.S. Cl. ............... 375/316; 375/345; 375/329; 375/340

(58) Field of Classification Search ............... 375/316, 375/345, 261, 279–281, 340, 319, 329, 332
See application file for complete search history.

(56) References Cited

U.S. PATENT DOCUMENTS

| 5,949,821 | A | 9/1999 | Emami et al. |
| 6,044,112 | A | 3/2000 | Koslov |
| 6,122,325 | A | 9/2000 | Mogre et al. |
| 6,925,132 | B2* | 8/2005 | Song et al. ............... 375/316 |
| 7,010,059 | B2* | 3/2006 | Song et al. ............... 375/316 |
| 7,130,359 | B2* | 10/2006 | Rahman ............... 375/316 |
| 2003/0179836 | A1* | 9/2003 | Masenten ............... 375/316 |
| 2004/0066861 | A1* | 4/2004 | Song et al. ............... 375/316 |
| 2005/0129141 | A1* | 6/2005 | Lee ............... 375/298 |
| 2006/0039506 | A1* | 2/2006 | D'Alessandro ............... 375/324 |

OTHER PUBLICATIONS

Xinping et al., "Gain/Phase Imbalnce and DC offset compensation IN Quadrature modulators," Xinping et al., IEEE, 2002, pp. 811-814.*
Fred Harris, "Digital Filter Equalization of Analog Gain and Phase Mismatch in I-Q Receivers," IEEE Int'l Conf. on 5th Univ. Personal Comm., vol. 2, pp. 793-796, Sep. 1996.

* cited by examiner

*Primary Examiner*—Tesfaldet Bocure
(74) *Attorney, Agent, or Firm*—Blakely, Sokoloff, Talyor & Zafman

(57) ABSTRACT

A quadrature transceiving system for compensating a direct current (CD) offset, a gain imbalance and a phase imbalance between an I-channel signal and a Q-channel in a quadrature transmitting system is disclosed. The quadrature transceiving system includes a transmitter for detecting a DC offset, a gain imbalance and a phase imbalance by using an average of a data aided signals included in a RF transmitting signal and compensating one of the I-channel and the Q-channel based on the detected imbalances and DC offset; and a receiver for detecting a DC offset, a gain imbalance and a phase imbalance by varying loop filter gain and compensating one of the I-channel and the Q-channel based on the detected imbalances and DC offset.

14 Claims, 7 Drawing Sheets

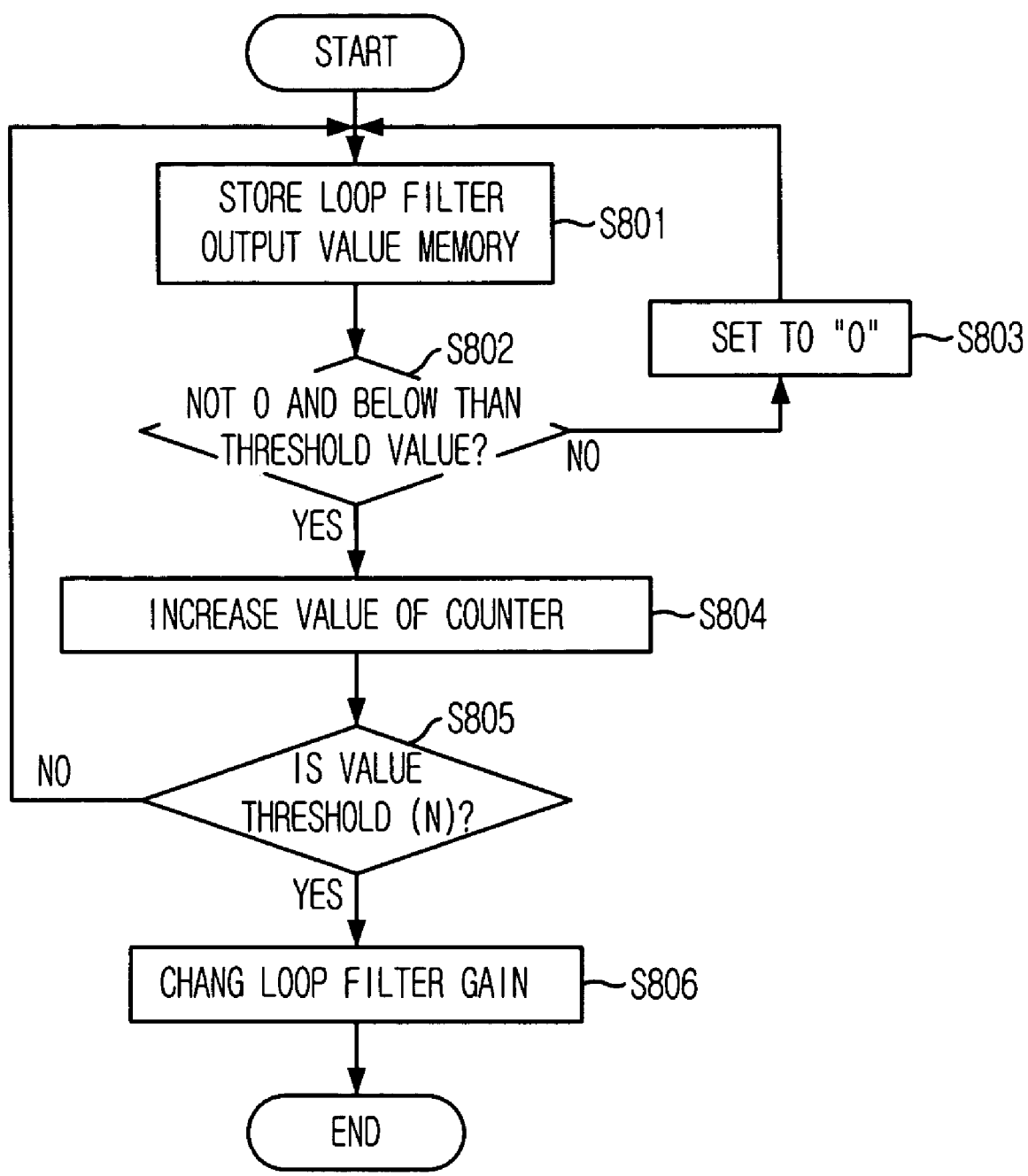

APPARATUS FOR COMPENSATING DC OFFSETS, GAIN AND PHASE IMBALANCES BETWEEN I-CHANNEL AND Q-CHANNEL IN QUADRATURE TRANSCEIVING SYSTEM

FIELD OF THE INVENTION

The present invention relates to an apparatus for compensating a direct current (DC) offset, a gain imbalance and a phase imbalance between an I-channel signal and a Q-channel signal; and, more particularly, to a quadrature transmitting system having an apparatus for compensating a direct current (DC) offset, a gain imbalance and a phase imbalance between an I-channel signal and a Q-channel signal by using an average value of data aided signals and a quadrature receiving system having an apparatus for compensating a direct current (DC) offset, a gain imbalance and a phase imbalance between an I-channel signal and a Q-channel signal by using a loop filter gain varied according an error signal between the I-channel signal and the Q-channel signal.

DESCRIPTION OF RELATED ARTS

A high speed wireless communication system receives a radio frequency (RF) signal through an antenna. The received RF signal is down-converted to an intermediate frequency (IF) signal and de-modulated for obtaining an original signal. For down-converting and demodulating the received RF signal, various analog devices such as a mixer and an amplifier are used and the analog devices may distort the received RF signal during down-converting or demodulating because of a dielectric characteristic between analog devices and imperfection of orthogonality.

One of reasons for distortion of the received RF signal is an imbalance between an I-channel signal and a Q-channel signal, which is called as an I/Q channel imbalance. The I/Q channel imbalance is caused since it is impossible to provide the I-channel signal having perfect 90° phase difference from the Q-channel signal, which is called the imperfection of orthogonality. The I/O channel imbalance also degrade a performance of a demodulator in a modulation/demodulation (MODEM). Therefore, there have been many methods for compensating the I/Q channel imbalance introduced.

A method for compensating an amplitude imbalance in a quadrature modulator has been introduced in U.S. Pat. No. 6,700,453 issued to Heiskala et al., entitled "AMPLITUDE IMBALANCE COMPENSATION OF QUADRATURE MODULATOR". In the method, the amplitude imbalance of the quadrature modulator is compensated by determining a first correlation on the basis of a first modulation signal and an output signal of the quadrature modulator by using a correlator, determining a second correlation on the basis of a second modulation signal and the output signal of the quadrature modulator by using a correlator and producing a compensation signal proportional to the amplitude imbalance on the basis of a ratio of the determined correlations and the first and second modulation signals. In this method, a plurality of correlators is required as many as the number of symbols for detecting and compensating the amplitude imbalance. Therefore, a plurality of correlators increases a complexity of a compensating system using the method.

Another method for compensating a phase and an amplitude imbalance is introduced in U.S. Pat. No. 6,512,800 issued to Amir et al., entitled "METHOD AND SYSTEM FOR CORRECTING PHASE AND AMPLITUDE IMBALANCES OF QUADRATURE MODULATED RF SIGNAL". The method previously detects I/Q imbalances by using a test signal and eliminates the I/Q imbalances by using a predistortion. However, it is very difficult to compensate the I/Q imbalance by pre-distorting a target channel signal based on the detected I/Q imbalances in a real time. Furthermore, the method takes comparatively long time for compensating the I/Q imbalances since it requires to accurately detect the I/Q imbalance.

There also have been various methods introduced for eliminating I/Q channel imbalance in a radio frequency (RF) direct conversion receiver.

A method for compensating I/Q channel imbalances in a RF direct conversion receiver has been introduced in U.S. Pat. No. 6,044,112 issued to Johua L. Koslov et al., entitled "METHODS AND APPARATUS FOR CORRECTING AMPLITUDE AND PHASE IMBALANCES IN DEMODULATORS". In this method, a demodulator includes a plurality of complex number adders, a plurality of complex number multipliers and a plurality of counters for compensating a gain and a phase imbalances. A complexity of the demodulator may be increased because of the plurality of complex number multipliers. Also, the demodulator is very sensitive to a noise because of simple counters. Furthermore, the demodulator decides an amount of I/Q channel imbalance according to increase or decrease of the counters, and therefore, a response speed of the demodulator is not stable. That is, in this method, the amount of I/Q channel imbalance may be decided according to increase or decrease of the counters, not according to a receiving signal.

There is also another method introduced in U.S. Pat. No. 5,949,821 issued to Shahria Emami et al., entitled "METHOD AND APPARATUS FOR CORRECTING PHASE AND GAIN IMBALANCES BETWEEN IN-PHASE (I) AND QUADRATURE (Q) COMPONENTS OF A RECEIVED SIGNAL BASED ON A DETERMINATION OF PEAK AMPLITUDES". The method compensates imbalances between an I-channel signal and a Q-channel signal by detecting an amplitude peak of demodulated I-channel signal and demodulated Q-channel signal. In this method, one of the I-channel and the Q-channel is selected as a standard channel and other is selected as an imbalanced channel. After selecting the standard channel and the imbalanced channel, the amplitude peak of each channel is obtained and a phase imbalance is computed by using an arc sine function and the obtained amplitude peak. However, in a case of implementing the arc sine function in a digital circuitry, a complexity of digital circuitry would be increased since an additional ROM table is required.

Furthermore, there is still anther method for compensating I/Q imbalance in U.S. Pat. No. 5,761,251 issued to Andrew Reid Wender, entitled "DUAL AUTOMATIC GAIN CONTROL AND DC OFFSET CORRECTION CIRCUIT FOR QAM DEMODULATION". The method detects a DC offset by digitalizing the QAM signal, obtaining positive signal samples and negative signal samples from a predetermined sampling region, averaging the positive signal samples and the negative signal samples, combining positive signal samples with negative signal samples and summing two averages. However, the method of Wender takes comparatively long time for compensating a even small error, may have difficulty to fine adjustment and may detect wrong DC offset since a large average value may be calculated according to the region of sampling signals in case of continuously receiving the positive and negative signals.

SUMMARY OF THE INVENTION

It is, therefore, an object of the present invention to provide an apparatus for detecting and compensating DC offsets, a gain and a phase imbalance of a radio frequency transmitting signal in a quadrature transmitting system by using a data aided signal in order to previously reduce a distortion of the radio frequency transmitting signal.

It is another object of the present invention to provide an apparatus for detecting and compensating DC offsets, a gain and a phase imbalance of a radio frequency receiving signal in a quadrature receiving system by using a loop filter gain automatically varied according to an imbalance between the I-channel signal and the Q-channel signal in order to a performance of acquisition and trace.

It is still another object of the present invention to provide an apparatus for detecting direct current (DC) offsets of an I-channel signal and a Q-channel signal, a gain imbalance and a phase imbalance between the I-channel signal and the Q-channel signal by using an average value of data aided signals and compensating the detected DC offset, the gain imbalance and the phase imbalance by previously distorting the I-channel signal and the Q-channel signal before generating the radio frequency transmitting signal by combining the I-channel signal and the Q-channel signal.

It is further still another object to the present invention to provide an apparatus for detecting direct current (DC) offsets of an I-channel signal and a Q-channel signal, a gain imbalance and a phase imbalance between the I-channel signal and the Q-channel signal by using a loop filter gain automatically varied according a difference between the I-channel signal and the Q-channel signal of a radio frequency receiving signal in a quadrature transceiving system.

It is further still another object to the present invention to provide a quadrature transceiving system including a transmitting having an apparatus for detecting direct current (DC) offsets of an I-channel signal and a Q-channel signal, a gain imbalance and a phase imbalance between the I-channel signal and the Q-channel signal by using an average value of data aided signals and compensating the detected DC offset, the gain imbalance and the phase imbalance by previously distorting the I-channel signal and the Q-channel signal before generating the radio frequency transmitting signal by combining the I-channel signal and the Q-channel signal; and a receiver having an apparatus for detecting direct current (DC) offsets of an I-channel signal and a Q-channel signal, a gain imbalance and a phase imbalance between the I-channel signal and the Q-channel signal by using a loop filter gain automatically varied according a difference between the I-channel signal and the Q-channel signal of a radio frequency. receiving signal.

In accordance with an aspect of the present invention, there is provided an apparatus for compensating a direct current offset of a standard channel signal and a target channel signal in a quadrature transmitting system, wherein the standard channel signal is selected by choosing one of an In-phase(I)-channel signal and a Quadrature-phase(Q)-channel signal and the target channel signal is selected by choosing another, the apparatus including: a radio frequency transmitting signal generator for generating a radio frequency transmitting signal by receiving a digital standard channel and a digital target channel, converting the digital standard channel and the digital target channel to analog channel signals and combining the analog channel signals; an obtainer for obtaining a signal level of the radio frequency transmitting signal from the radio frequency transmitting signal generator; a converter for converting the detected signal level to a digital level signal; a detector for detecting a first offset of a standard channel signal included in the radio frequency transmitting signal by multiplying a sign of the digital standard channel signal and the digital signal level as a first multiplying result, integrating the first multiplying result by using an average of data aided signal included in the radio frequency transmitting signal, and detecting a second offset of a target channel signal included in the radio frequency transmitting signal by multiplying a sign of the digital target channel signal and the digital signal level as a second multiplying result, integrating the second multiplying result by using the average of data aided signal included in the radio frequency transmitting signal; and a compensator for compensating the standard channel signal according to the first DC offset and compensating the target channel signal according to the second DC offset.

In accordance with another aspect of the present invention, there is provided an apparatus for compensating a gain imbalance between a standard channel signal and a target channel signal in a quadrature transmitting system, wherein the standard channel signal is selected by choosing one of an In-phase(I)-channel signal and a Quadrature-phase(Q)-channel signal and the target channel signal is selected by choosing another, the apparatus including: a generator for generating a radio frequency transmitting signal by receiving a digital standard channel and a digital target channel, converting the digital standard channel and the digital target channel to analog channel signals and combining the analog channel signals; an obtainer for obtaining a signal level of the radio frequency transmitting signal from the generator; a converter for converting the detected signal level to a digital level signal; a detector for detecting a gain imbalance between a standard channel signal and a target channel signal included in the radio frequency transmitting signal by multiplying a first absolute value of the digital standard channel signal and the digital signal level as a first multiplying result, multiplying a second absolute value of the digital target channel signal and the digital signal level as a second multiplying result, obtaining a difference between the first multiplying result and the second multiplying result and integrating the difference by using an average of data aided signal included in the radio frequency transmitting signal; and a compensator for compensating the target channel signal by eliminating the detected gain imbalance from the digital target channel signal.

In accordance with still another aspect of the present invention, there is provided an apparatus for compensating a phase imbalance between a standard channel signal and a target channel signal in a quadrature transmitting system, wherein the standard channel signal is selected by choosing one of an In-phase(I)-channel signal and a Quadrature-phase (Q)-channel signal and the target channel signal is selected by choosing another, the apparatus including: a generator for generating a radio frequency transmitting signal by receiving a digital standard channel and a digital target channel, converting the digital standard channel and the digital target channel to analog channel signals and combining the analog channel signals; an obtainer for obtaining a signal level of the radio frequency transmitting signal from the generator; a converter for converting the detected signal level to a digital level signal; a detector for detecting the phase imbalance between the standard channel signal and the target channel signal included in the radio frequency transmitting signal by multiplying a first sign of the digital standard channel signal and a second sign of the digital target channel signal as a first multiplying result, multiplying the first multiplying result and the digital signal level as a second multiplying result, integrating the second multiplying result by using an average of data aided signal included in the radio frequency transmitting signal; and a compensator for compensating the target channel signal by multiplying the detected phase imbalance and the digital standard channel signal and eliminating the multiplying result from the target channel signal.

In accordance with still another aspect of the present invention, there is provided an apparatus for compensating imbalances between a standard channel signal and a target channel signal in a quadrature transmitting system, wherein the standard channel signal is selected by choosing one of an In-phase(I)-channel signal and a Quadrature-phase(Q)-channel signal and the target channel signal is selected by choosing another, the apparatus including: a generator for generating a radio frequency transmitting signal by receiving a digital standard channel and a digital target channel, converting the digital standard channel and the digital target channel to analog channel signals and combining the analog channel signals; a obtainer for obtaining a signal level of the radio frequency transmitting signal from the generator; a converter for converting the detected signal level to a digital level signal; a gain imbalance compensator for detecting a gain imbalance between a standard channel and a target channel in the radio frequency transmitting signal by using a data aided signal included in the radio frequency transmitting signal and compensating the target channel based on the detected gain imbalance; and a phase imbalance compensator for detecting a phase imbalance between the standard channel and the target channel in the radio frequency transmitting signal by using the data aided signal included in the radio frequency transmitting signal and compensating the target channel based on the detected phase imbalance.

In accordance with further still another aspect of the present invention, there is provided an apparatus for compensating a direct current offset of a standard channel signal and a target channel signal in a quadrature receiving system, wherein the standard channel signal is selected by choosing one of an In-phase(I)-channel signal and a Quadrature-phase (Q)-channel signal and the target channel signal is selected by choosing another, the apparatus including: a DC error signal detector for detecting DC error signals in the standard channel signal and the target channel signal by obtaining two samples from the standard channel signal and the target channel signal, adding two samples to generate a sum and determining polarities of the standard channel signal and the target channel signal based on the sum; a DC offset detector for detecting DC offsets of the standard channel signal and the target channel signal by accumulating the DC error signals by forming a first loop with an adder and a buffer, determining a mode according to the accumulated DC error signals and varying a loop filter gain according to the determined mode; and a DC offset compensator for compensating the standard channel signal by adding the DC offset to the standard channel signal and compensating the target channel signal by adding the DC offset to the target channel signal.

In accordance with further still another aspect of the present invention, there is provided an apparatus for compensating a gain imbalance between a standard channel signal and a target channel signal in a quadrature receiving system, wherein the standard channel signal is selected by choosing one of an In-phase(I)-channel signal and a Quadrature-phase(Q)-channel signal and the target channel signal is selected by choosing another, the apparatus including: a gain error detector for detecting a gain error signal by obtaining a first absolute value from the standard channel signal and a second absolute value from the target channel signal, and subtracting the second absolute value from the first absolute value; a gain imbalance detector for detecting a gain imbalance between the standard channel signal and the target channel signal by accumulating the gain error signal by using a loop formed with an adder and a buffer, determining a type of a mode according to the accumulated gain error signal and changing a loop filter gain according to the determined type of mode; and a gain imbalance compensator for compensating the target channel signal by multiplying the detected gain imbalance to the target channel signal.

In accordance with further still another aspect of the present invention, there is provided an apparatus for compensating a phase imbalance between a standard channel signal and a target channel signal in a quadrature receiving system, wherein the standard channel signal is selected by choosing one of an In-phase(I)-channel signal and a Quadrature-phase(Q)-channel signal and the target channel signal is selected by choosing another, the apparatus including: a phase error detector for detecting a phase error signal by multiplying the standard channel signal and the target channel signal; a phase imbalance detector for detecting a phase imbalance between the standard channel signal and the target channel signal by accumulating the phase error signal by using a loop formed with an adder and a buffer, determining a type of mode according to the accumulated phase error signals and changing a loop filter gain according to the type of mode; and a phase imbalance compensator for compensating the target channel signal by multiplying the detected phase imbalance to the standard channel signal and adding the multiplying result to the target channel signal.

In accordance with further still another aspect of the present invention, there is provided an apparatus for compensating imbalances between a standard channel signal and a target channel signal in a quadrature receiving system, wherein the standard channel signal is selected by choosing one of an In-phase(I)-channel signal and a Quadrature-phase (Q)-channel signal and the target channel signal is selected by choosing another, the apparatus including: a gain imbalance compensator for compensating a gain imbalance by obtaining a gain error signal from the standard channel signal and the target channel signal, detecting a gain imbalance between the standard channel signal and the target channel signal by using a loop filter gain varied according to the obtained gain error signal and compensating the target channel signal based on the detected gain imbalance; and a phase imbalance compensator for compensating a phase imbalance by obtaining a phase error signal from the standard channel signal and the target channel signal, detecting a phase imbalance between the standard channel signal and the target channel signal by using a loop filter gain varied according to the obtained phase error signal and compensating the target channel signal based on the detected phase imbalance.

BRIEF DESCRIPTION OF THE DRAWINGS

The above and other objects and features of the present invention will become better understood with regard to the following description of the preferred embodiments given in conjunction with the accompanying drawings, in which:

FIG. 8 is a flowchart showing operations for varying a loop filter gain in accordance with a preferred embodiment of the present invention.

DETAILED DESCRIPTION OF THE INVENTION

Hereinafter, an apparatus for compensating a DC offset, a gain imbalance and a phase imbalance of I/Q channels by using a data aided signal of by using a loop filter gain in accordance with a preferred embodiment of the present invention will be described in more detail with reference to the accompanying drawings.

In the present invention, a quadrature transmitting system is operated based on a burst type packet transmitting mode and the quadrature transmitting system detects imbalances by using a data aided signal and compensating the imbalances by previously distorting a radio frequency (RF) transmitting signal based on the detected imbalances before generating the RF transmitting signal.

The quadrature transmitting system is currently selected as a European digital satellite broadcasting system (DVB-S, DVB-RCS).

Figure 1:
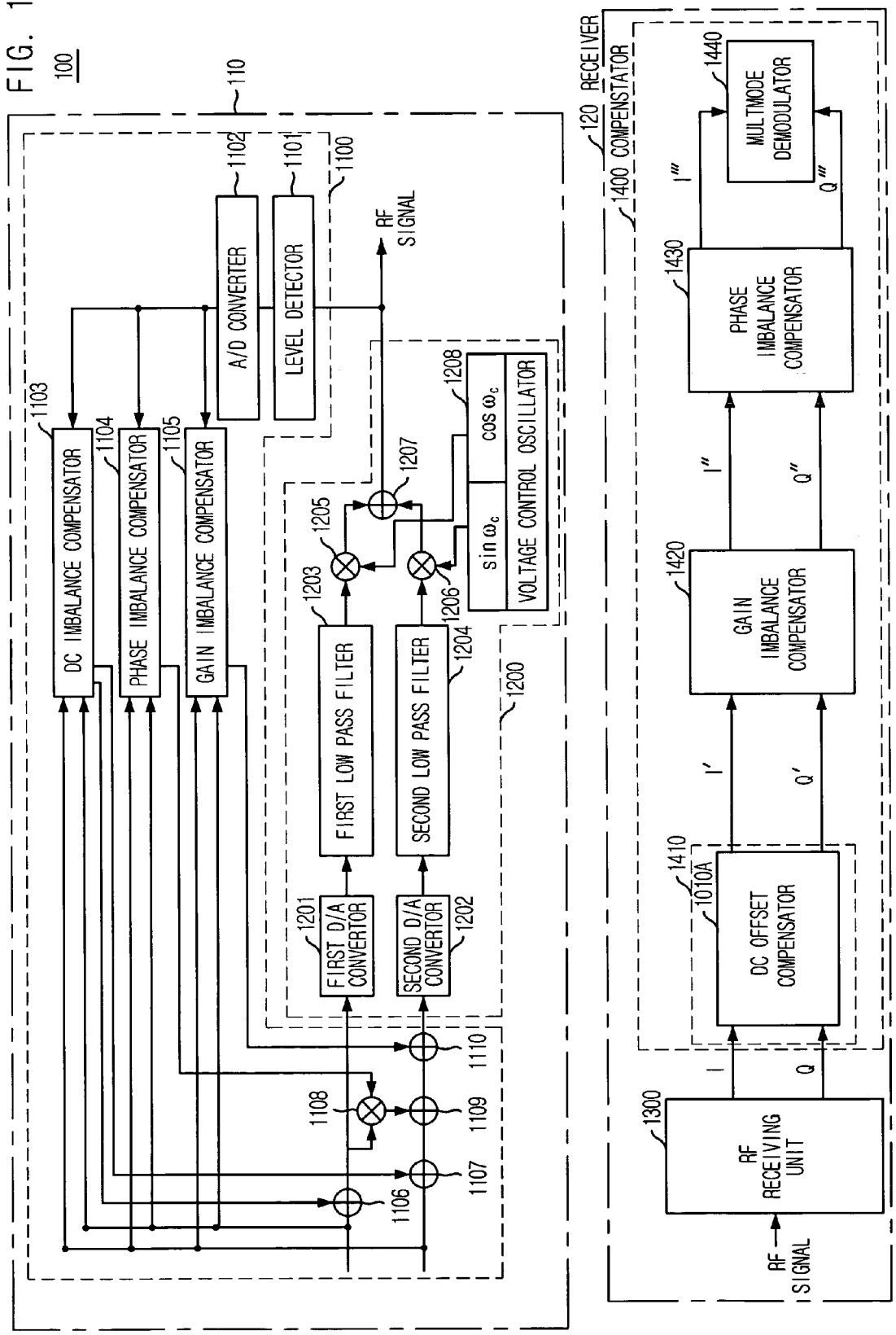
FIG. 1 is a diagram for illustrating a quadrature transceiving system having an apparatus for compensating DC offsets, a gain imbalance and a phase imbalance between an I-channel signal and a Q-channel signal in accordance with a preferred embodiment of the present invention.

FIG. 1 is a diagram for illustrating a quadrature transceiving system in accordance with a preferred embodiment of the present invention.

As shown, the quadrature transceiving system 100 includes a transmitter 110 and a receiver 120.

The transmitter 110 includes a compensator 1100 and a radio frequency (RF) signal generator 1200.

The RF signal generator 1200 includes a first and a second digital-to-analog (D/A) converters 1201, 1202, a first and a second low pass filters 1203, 1204, a COS adder 1205, a SIN adder 1206, a combiner 1207 and a voltage control oscillator 1208.

The RF signal generator 1200 receives a digital I-channel signal and a digital Q-channel signal, converts the digital I-channel signal and the digital Q-channel signal to an analog I-channel signal and an analog Q-channel signal at the first and the second D/A converters 1201, 1202. After converting, the first and the second low pass filters 1203, 1204 filter the analog I-channel and the analog Q-channel signals and the filtered I/Q channel signals are voltage-controlled at the COS adder 1205 and the SIN adder 1206 by receiving voltage control signals from the oscillator 1208. The voltage controlled signals are combined to generate the RF transmitting signal.

The compensator 1100 includes a level detector 1101, an analog-to-digital (A/D) converter 1102, a direct current (DC) offset compensator 1103, a gain imbalance compensator 1104, a phase imbalance compensator 1105, a first DC adder 1106, a second DC adder 1107, a multiplexer 1108, a gain adder 1109 and a phase adder 1110.

The level detector 1101 receives the RF signal generated from the RF signal generator 1200 and detects a signal level ($I^2+Q^2$) from the RF signal.

The A/D converter 1102 converts the detected signal level ($I^2+Q^2$) to a digital signal.

The DC offset compensator 1103 detects direct current (DC) offsets in the digital I-channel signal and the digital Q-channel signal by using an average value of data aided signals, wherein the data aided signals are included in the RF signal and used for modulating a digital detecting signal, an I-channel signal and a Q-channel signal. After detecting the DC offsets, the digital I-channel signal and the digital Q-channel signal are compensated according to the detected the DC offsets by using two adders 1106 and 1107.

The phase imbalance compensator 1104 detects a phase imbalance between an I-channel signal and a Q-channel signal of the RF signal by using an average value of data aided signals, wherein the data aided signals are included in the RF signal and used for modulating a digital detecting signal, an I-channel signal and a Q-channel signal. After detecting the phase imbalance, the digital Q-channel signal is compensated according to the detected the phase imbalance by using an adder 1109 and a multiplier 1108.

The gain imbalance compensator 1105 detects a gain imbalance between an I-channel signal and a Q-channel signal of the RF signal by using an average value of data aided signals, wherein the data aided signals are included in the RF signal and used for modulating a digital detecting signal, an I-channel signal and a Q-channel signal. After detecting the gain imbalance, the digital Q-channel signal is compensated according to the detected the phase imbalance by using an adder 1110.

The receiver 120 includes a RF receiving unit 1300 and a compensator 1400.

The RF receiving unit 1300 receives the RF signal from the transmitter 110 and generates an I-channel signal I and a Q-channel signal Q.

The compensator 1400 receives the I-channel signal I and the Q-channel signal Q and detects DC offsets of the I-channel signal I and the Q-channel signal Q, a gain imbalance and a phase imbalance between the I-channel signal I and the Q-channel signal Q. After detecting, the compensator 1400 eliminates the DC offsets, the gain imbalance and the phase imbalance from the I-channel signal I and the Q-channel signal Q.

The compensator 1400 of the receiver 120 includes a DC offset compensator 1410, a gain imbalance compensator 1420, a phase imbalance compensator 1430 and a multi-mode demodulator 1440.

The DC offset compensator 1410 receives the I-channel signal I and the Q-channel signal Q, detects DC offsets of the I-channel signal I and the Q-channel signal Q by using the loop filter gain automatically varied according to the DC offsets. And, the DC offset compensator 1410 generates a DC controlled I-channel signal I' and a DC controlled Q-channel signal Q' by eliminating the DC offsets from the I-channel signal I and the Q-channel signal Q.

The gain imbalance compensator 1420 receives the DC controlled I-channel signal I' and the DC controlled Q-channel signal Q', detects a gain imbalance between the DC controlled I-channel signal I' and the DC controlled Q-channel signal Q' by using the loop filter gain automatically varied according to the gain imbalance. And, the gain imbalance compensator 1420 generates a gain controlled I-channel signal I" and a gain controlled Q-channel signal Q" by eliminating the gain imbalance from the DC controlled Q-channel signal Q'.

The phase imbalance compensator 1430 receives the gain controlled I-channel signal I" and the gain controlled Q-channel signal Q", detects a phase imbalance between the gain controlled I-channel signal I" and the gain controlled Q-channel signal Q" by using the loop filter gain automatically varied according to the gain imbalance. And, the phase imbalance compensator 1430 generates a phase controlled I-channel signal I'" and a phase controlled Q-channel signal Q'" by eliminating the phase imbalance from the gain controlled Q-channel signal Q".

After compensating, the phase controlled I-channel and Q-channel signals I'" and Q'" are inputted to the multimode demodulator 1440.

Hereinafter, the DC offset compensator 1103, the phase imbalance compensator 1104 and the gain imbalance compensator 1105 in the transmitter 110 are explained in detail.

Figure 2:
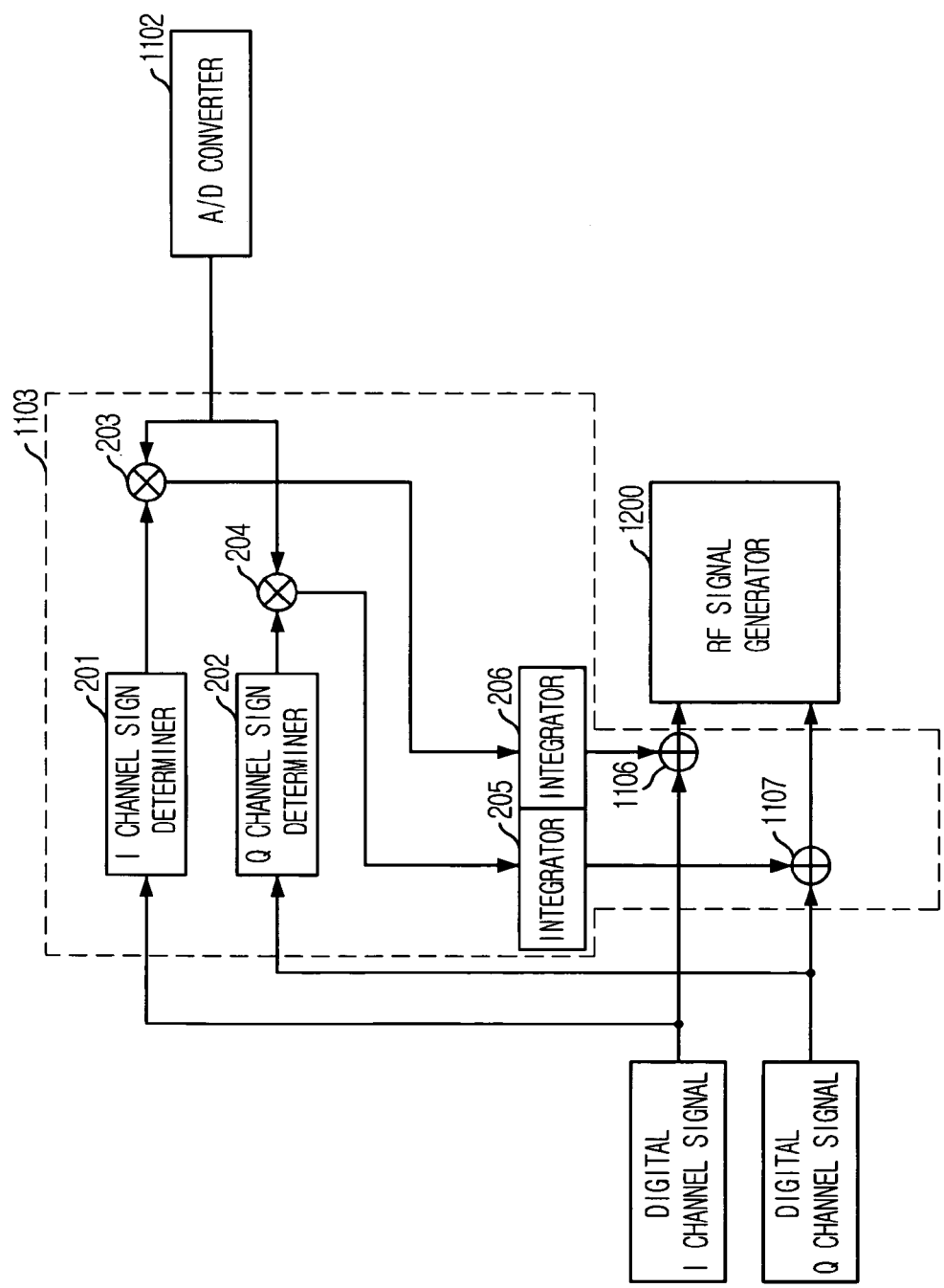
FIG. 2 is a detailed diagram for illustrating a DC offset compensator 1103 of a transmitter 110 in FIG. 1 in accordance with a preferred embodiment of the present invention.

FIG. 2 is a detailed diagram for illustrating a DC offset compensator 1103 in FIG. 1.

As shown, the DC offset compensator 1103 includes an I-channel signal determiner 201, a Q-channel sign determiner 202, a first multiplier 203, a second multiplier 204, a first integrator 205, a second integrator 206, a first DC adder 1106 and a second DC adder 1107.

The DC offset compensator 1103 detects DC offsets of an I-channel signal and a Q-channel signal of the RF signal and the detected DC offset is added to the digital I-channel signal and the digital Q-channel signal for previously distorting the digital I-channel signal and the digital Q-channel signal before generating the RF signal in order to compensating the DC offset.

Detailed operations of the DC offset compensator 1103 are explained hereinafter.

The I-channel signal determiner 201 receives the digital I-channel signal and detects a sign (sign(I)) of the digital I-channel signal.

The Q-channel signal determiner 202 receives the digital Q-channel signal and detects a sign (sign(Q)) of the digital Q-channel signal.

The first and the second multipliers 203 and 204 receives the digitalized signal level ($I^2+Q^2$) of the RF signal from the A/D converter 1102 by converting the signal level ($I^2+Q^2$) from the level detector 1101. The level detector 1101 receives the RF signal which is distorted by the voltage control oscillator 1208 and detects the signal level. The detected signal level is expressed as:

$$(I(t)+DC_I)^2+(Q(t)+DC_Q)^2=I^2(t)+2\cdot DC_I I(t)+DC_I^2+Q^2(t)+2\cdot DC_Q Q(t)+DC_Q^2)\quad\text{Eq. 1}$$

In Eq. 1, I(t) and Q(t) are an analog I-channel signal and an analog Q-channel signal generated from the first and the second D/A converters 1201 and 1202 in FIG. 1, respectively. And, $DC_I$ is a DC offset of the analog I-channel signal generated from the voltage control oscillator 1208 and $DC_Q$ is a DC offset of the analog Q-channel signal generated from the voltage control oscillator 1208.

The RF signal includes a data aided signal having a predetermined number of + or − levels to make 0 when all levels included in an I-channel signal and an Q-channel signal are added. Therefore, the number of levels included in the RF signal is equal to the predetermined number of levels in the data aided signal. For example, if the RF signal has +1 or −1 levels and the I-channel signal and the Q-channel signal of the RF signal includes 9 −1's and 10 +1', the data aided signal includes 9 +1's and 10 −1's for making 0 when all levels included in the I-channel signal and the Q-channel signal are added.

As mentioned above, the first multiplier 203 receives the detected sign (sign(I)) of the digital I-channel signal from the I-channel sign determiner 201 and the digitalized signal level ($I^2+Q^2$) from the A/D converter 1102. The first multiplier 203 multiplies the detected sign (sign(I)) and the digitalized signal level ($I^2+Q^2$) as:

$$\begin{aligned}I'(t) &= E[I^2(t)\text{sign}(I)] + E[Q^2(t)]E[\text{sign}(I)] + \\ &\quad 2\cdot DC_1 E[I(t)\text{sign}(I)] + 2\cdot DC_Q E[Q(t)]E[\text{sign}(I)] + \\ &\quad DC_1^2 E[\text{sign}(I)] + DC_Q^2 E[\text{sign}(I)] \\ Q'(t) &= E[I^2(t)]E[\text{sign}(Q)] + E[Q^2(t)\text{sign}(Q)] + \\ &\quad 2\cdot DC_1 E[I(t)]E[\text{sign}(Q)] + 2\cdot DC_Q E[Q(t)\text{sign}(Q)] + \\ &\quad DC_1^2 E[\text{sign}(Q)] + DC_Q^2 E[\text{sign}(Q)]\end{aligned}\quad\text{Eq. 2}$$

After multiplying, the first and the second integrators 205 and 206 integrate I'(t) and Q'(t) from the first and the second multipliers 203 and 204. That is, it is same as an averaging operation (E[.]).

After integration, I'(t) and Q'(t) are simplified since E[sing (I)]=0, E[sign(Q)]=1, $I^2(t)$=1, $Q^2(t)$=1 as:

$$I'(t)=2\cdot DC_I E[|I(t)|] \quad Q'(t)=2\cdot DC_Q E[|Q(t)|]\quad\text{Eq. 3}$$

After integrating, I'(t) and Q'(t) is added to the digital I-channel signal and the digital Q-channel signal by using the first DC adder 1106 and the second DC adder 1107.

Figure 3:
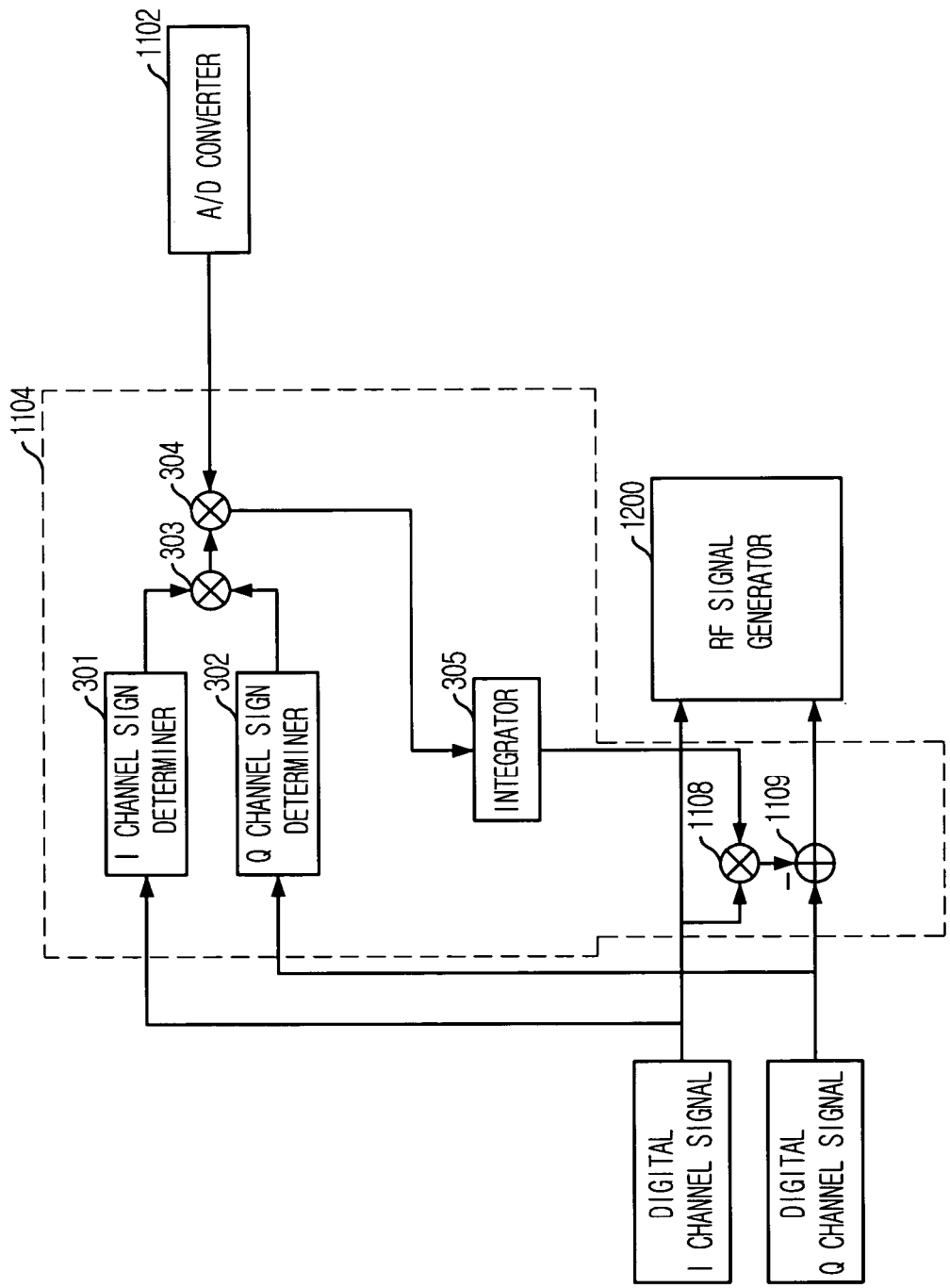
FIG. 3 is detailed diagram for illustrating a phase imbalance compensator 1104 of a transmitter 110 in FIG. 1 in accordance with a preferred embodiment of the present invention.

FIG. 3 is detailed diagram for illustrating a phase imbalance compensator 1104 in FIG. 1.

As shown, the phase imbalance compensator 1104 includes an I-channel signal determiner 301, a Q-channel sign determiner 302, a first multiplier 303, a second multiplier 304, an integrator 305, a phase multiplier 1108 a and a second adder 1107.

The phase offset compensator 1105 detects a phase imbalance between an I-channel signal and a Q-channel signal of the RF signal by multiplying sings of the digital I-channel signal and the digital Q-channel signal, multiplying the multiplied signs with the detected signal level and integrating the multiplied detected signal level by using an average of data aided signals included in the RF signal. After detecting the phase imbalance, the digital I-channel signal and the digital Q-channel signal are compensated according to the detected phase imbalance. That is, the digital Q-channel signal are previously distorted according to the detected phase imbalance before generating the RF signal.

Detailed operations of the phase imbalance compensator 1104 are explained hereinafter.

The I-channel signal determiner 301 receives the digital I-channel signal and detects a sign (sign(I)) of the digital I-channel signal.

The Q-channel signal determiner 302 receives the digital Q-channel signal and detects a sign (sign(Q)) of the digital Q-channel signal.

The first multiplier 303 receives the signs (sign(I), sign (Q)) from the I-channel and the Q-channel signal determiners 302 and 303 and multiplies the signs.

The second multiplier 304 receives the digitalized signal level from the A/D converter 1102 by converting the signal level from the level detector 1101. The level detector 1101 receives the RF signal which is distorted by the voltage control oscillator 1208 and detects the signal level. The detected signal level is expressed as:

$$(I(t)+Q(t)\sin \phi)^2+(Q(t)\cos \phi)^2=I^2(t)+Q^2(t)+2I(t)Q(t)\sin \phi \qquad \text{Eq. 4}$$

In Eq. 4, I(t) and Q(t) are an analog I-channel signal and an analog Q-channel signal generated from the first and the second D/A converters 1201 and 1202 respectively. And, $\phi$ is the phase imbalance between the analog I-channel signal and the analog Q-channel signal generated from the voltage control oscillator 1208.

As mentioned above, the RF signal includes a data aided signal having a predetermined number of + or − levels to make 0 when all levels included in an I-channel signal and an Q-channel signal are added. Therefore, the number of levels included in the RF signal is equal to the predetermined number of levels in the data aided signal. For example, if the RF signal has +1 or −1 levels and the I-channel signal and the Q-channel signal of the RF signal includes 9 −1's and 10 +1', the data aided signal includes 9 +1's and 10 −1's for making 0 when all levels included in the I-channel signal and the Q-channel signal are added.

The second multiplier 304 also receives the multiplied signs. After receiving, the second multiplier 304 multiplies the multiplied signs and the digitalized signal level as:

$$I^2(t)\text{sign}|I(t)|\text{sign}|Q(t)|+Q^2(t\text{sign}|I(t)|\text{sign}|Q(t)|+2I(t)\text{sign}[I(t)]Q(t)\text{sign}[Q(t)]\sin \phi \qquad \text{Eq. 5}$$

After multiplying, the integrator 305 integrates the multiplying result from the second multiplier 304. That is, it is same as an averaging operation (E[.]).

After integration, Eq.5 is simplified since E[sing(I)]=0, E[sign(Q)]=0, I²(t)=1, Q²(t)=1 as:

$$2E[|I(t)|]E[|Q(t)|]\sin \phi \qquad \text{Eq. 6}$$

After integrating, the detected phase imbalance can be obtained according to the Eq. 6 and the phase imbalance is compensated by a integration result is multiplied to the digital Q-channel signal and then the multiplying result is subtracted from the digital I-channel signal to eliminate the phase imbalanced from the digital I-channel signal.

Figure 4:
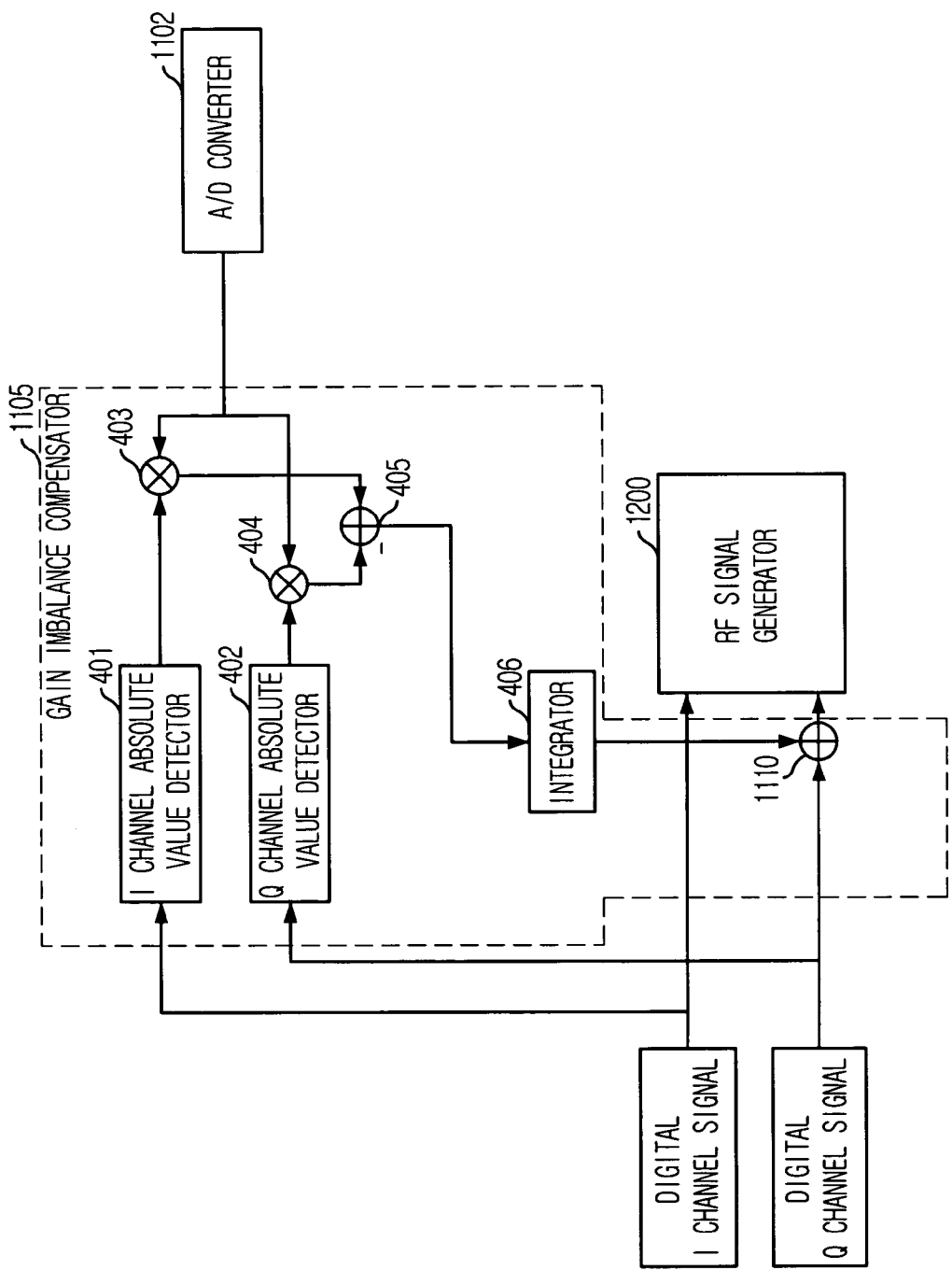
FIG. 4 is detailed diagram for illustrating a gain imbalance compensator 1105 of a transmitter 110 in FIG. 1 in accordance with a preferred embodiment of the present invention.

FIG. 4 is detailed diagram for illustrating a gain imbalance compensator 1105 in FIG. 1.

As shown, the gain imbalance compensator 1105 includes an I-channel absolute value detector 401, a Q-channel absolute value detector 402, a first multiplier 403, a second multiplier 404, a subtracter 405, an integrator 406 and a gain adder 1110.

The gain imbalance compensator 1105 detects a gain imbalance between an I-channel signal and a Q-channel signal of the RF signal by obtaining absolute values of the digital I-channel signal and the digital Q-channel signal, multiplying the absolute values with an I-channel signal and an Q-channel signal of the RF signal respectively, adding the results and integrating the adding result by using an average of data aided signal included in the RF transmitting signal. After detecting the gain imbalance, the digital I-channel signal and the digital Q-channel signal are compensated according to the detected gain imbalance. That is, the digital Q-channel signal is previously distorted according to the detected gain imbalance before generating the RF transmitting signal.

Detailed operations of the gain imbalance compensator 1105 are explained hereinafter.

The I-channel absolute value detector 401 receives the digital I-channel signal and obtains a first absolute value (|I(t)|) of the digital I-channel signal.

The Q-channel absolute value detector 402 receives the digital Q-channel signal and obtains a second absolute value (|Q(t)|) of the digital Q-channel signal.

The first multiplier 403 receives the first absolute value and receives the digitalized signal level from the A/D converter 1102 by converting the signal level from the level detector 1101. The level detector 1101 receives the RF signal which is distorted by the voltage control oscillator 1208 and detects the signal level. The detected signal level is expressed as:

$$I^2(t)+((1+\alpha)Q(t))^2=I^2(t)+Q^2(t)+(2\alpha+\alpha^2)Q^2(t) \qquad \text{Eq. 7}$$

In Eq. 7, I(t) and Q(t) are an analog I-channel signal and an analog Q-channel signal generated from the first and the second D/A converters 1201 and 1202 respectively. And, α is the gain imbalance of the Q-channel signal basis on the analog I-channel signal.

As mentioned above, the RF signal includes a data aided signal having a predetermined number of + or − levels to make 0 when all levels included in an I-channel signal and an Q-channel signal are added. Therefore, the number of levels included in the RF signal is equal to the predetermined number of levels in the data aided signal. For example, if the RF signal has +1 or −1 levels and the I-channel signal and the Q-channel signal of the RF signal includes 9 −1's and 10 +1', the data aided signal includes 9 +1's and 10 −1's for making 0 when all levels included in the I-channel signal and the Q-channel signal are added.

As mentioned above, the first multiplier 403 multiplies the first absolute value with the RF signal to generate a first multiplying result. Also, the second multiplier 404 multiplies the second absolute value with the RF signal to generate a second multiplying result.

The subtracter 405 subtracts the first multiplying result from the second multiplying result to generate a subtracting result. The subtracting result can be expressed as:

$$\{I^2(t)|I(t)|+Q^2(t)|I(t)|+(2\alpha+\alpha^2)Q^2(t)|I(t)|\}-\{I^2(t)|Q(t)|+Q^2(t)|Q(t)|+(2\alpha+\alpha^2)Q^2(t)|Q(t)|\} \qquad \text{Eq. 8}$$

After subtracting, the integrators 406 integrate the subtracting result from the subtractor 405. That is, it is same as an averaging operation (E[.]).

After integration, Eq. 8 is simplified since E[sing(I)]=0, E[sign(Q)]=0, I²(t)=1, Q²(t)=1 as:

$$E[Q^2(t)](2\alpha+\alpha^2)\{E[|I(t)|]-E[|Q(t)|]\} \qquad \text{Eq. 9}$$

After integrating, the detected gain imbalance can be obtained according to the Eq. 9 and the gain imbalance is compensated by adding the gain imbalance to the digital Q-channel signal.

Hereinafter, the DC offset compensator 1410, the gain imbalance compensator 1420 and the phase imbalance compensator 1430 in the receiver 120 are explained in detail.

Figure 5:
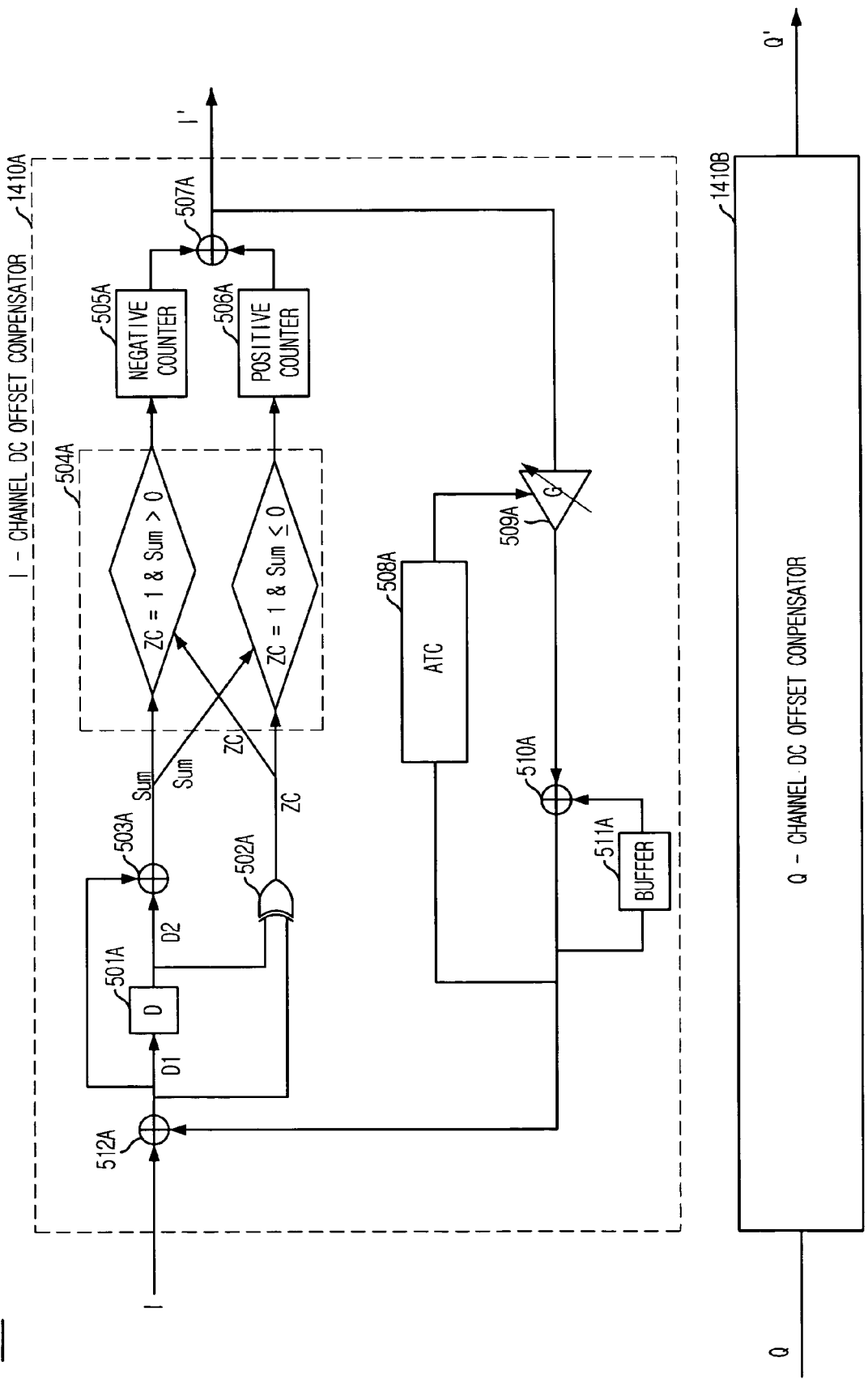
FIG. 5 is a detailed diagram illustrating a direct current (DC) offset compensator 1410 of a receiver 120 in FIG. 1 in accordance with a preferred embodiment of the present invention.

FIG. 5 is a detailed diagram illustrating a direct current (DC) offset compensator 1410 of the receiver 120 in FIG. 1 in accordance with a preferred embodiment of the present invention.

The DC offset compensator 1410 receives an I-channel signal I and a Q-channel signal Q from a RF receiving unit

1300 and compensating the DC offsets of I-channel signal I and a Q-channel signal Q. For compensating the DC offsets, the DC offset compensator 1410 includes an I-channel DC offset compensator 1410A for detecting the DC offset of the I-channel signal I and compensating the I-channel signal I according to the detected DC offset, and a Q-channel DC offset compensator 1410B for detecting the DC offset of the Q-channel signal Q and compensating the Q-channel signal Q according to the detected DC offset.

As shown in FIG. 5, the I-channel DC offset compensator 1410A includes a delay 501A for obtaining two samples from the I-channel signal I; an exclusive OR gate 502A for obtaining a polarity (ZC) of the obtained two samples; a first adder 503A for adding the obtained two samples to generate a sum (SUM); a determiner 504A for determining whether the polarity (ZC) is 1 and the sum (SUM) is larger than 0; a negative counter 505A for generating −1 when the polarity (ZC) is 1 and the sum (SUM) is larger than 0; a positive counter 506A for generating 1 when the polarity (ZC) is 1 and the sum (SUM) is smaller or equal to 0; a second adder 507A for adding results of the positive counter 506A and the negative counter 505A; a third adder 510A for accumulating DC offsets of the obtained two samples; a buffer 511A for storing accumulated DC offsets; an ATC 508A for transferring a mode of a compensating operation according to the accumulated DC offsets in order to change a loop filter gain; a variable gain controller 509A for dynamically amplifying the DC offset according to the changed loop filter gain and providing the amplified DC offset to the third adder 510A; and a fourth adder for adding the accumulated DC offset to the I-channel signal I.

Hereinafter, compensating DC offset operation in the I-channel DC offset compensator 1410A is explained.

At first, two samples from the I-channel signal are obtained by using the delay 501A and it determines whether polarities of the obtained two polarities are different at the exclusive OR gate 502A. Also, the obtained two samples are added at the first adder 503A. Based on the sum (SUM) from the first adder 503A and the polarity (ZC), the determiner 504A determines whether the I-channel signal I and the Q-channel signal Q are asymmetric. If the sum is positive, the determiner increases a counter of the negative counter 505A since the I-channel signal I and the Q-channel signal Q are asymmetric. If the sum is negative, the determiner decreases a counter of the positive counter 506A since the I-channel signal I and the Q-channel signal Q are symmetric. The counters of the negative counter 505A and the positive counter 506 are added by the second adder 507A and the sum of the counters are accumulated by the third adder 510A and the ATC 508 which form a loop. Based on the accumulated DC offset, the ATC 508A determines a type of mode to transfer. After determining, the variable gain controller 509A controls the loop filter gain stored in a memory such as a register according to the determined mode.

The fourth adder 512A compensates the I-channel signal I by adding the DC offset to the I-channel signal I, wherein the DC offset is accumulated output values from the variable gain controller 509A.

As mentioned above, the I-channel DC offset compensator 1401A detects the DC offset of the I-channel signal I and generates a DC controlled I-channel signal I' by compensating the I-channel signal based on the detected DC offset.

The Q-channel DC offset compensator 1401B also receives the Q-channel signal Q from the RF receiving unit 1300 and detects a DC offset of the Q-channel signal Q. After detecting the DC offset, the Q-channel DC offset compensator 1401B generates a DC controlled Q-channel signal.

The Q-channel DC offset compensator 1401B a delay 501B for obtaining two samples from the Q-channel signal Q; an exclusive OR gate 502B for obtaining a polarity (ZC) of the obtained two samples; a first adder 503B for adding the obtained two samples to generate a sum (SUM); a determiner 504B for determining whether the polarity (ZC) is 1 and the sum (SUM) is larger than 0; a negative counter 505B for generating −1 when the polarity (ZC) is 1 and the sum (SUM) is larger than 0; a positive counter 506B for generating 1 when the the polarity (ZC) is 1 and the sum (SUM) is smaller or equal to 0; a second adder 507B for adding results of the positive counter 506B and the negative counter 505B; a third adder 510B for accumulating DC offsets of the obtained two samples; a buffer 511B for storing accumulated DC offsets; an ATC 508B for converting a mode according to the accumulated DC offsets for varying a loop filter gain; a variable gain controller 509B for dynamically amplifying the DC offset according to the loop filter gain and providing the amplified DC offset to the third adder 510B; and a fourth adder for adding the accumulated DC offset to the I-channel signal I.

Since operations of the Q-channel DC offset compensator 1410B is exactly same to the operation of the I-channel DC offset compensator 1410A, detailed explanation of the Q-channel DC offset compensator 1410B is omitted.

Figure 6:
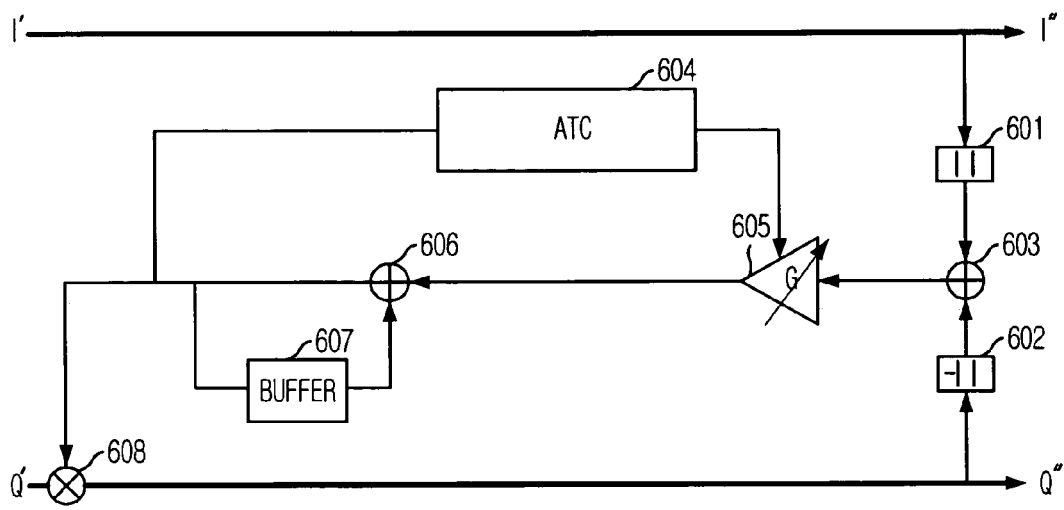
FIG. 6 is a detailed diagram illustrating a gain imbalance compensator 1420 of a receiver 120 in FIG. 1 in accordance with a preferred embodiment of the present invention.

FIG. 6 is a detailed diagram illustrating a gain imbalance compensator 1420 of a receiver 120 in FIG. 1 in accordance with a preferred embodiment of the present invention.

As shown, the gain imbalance compensator 1420 detects a gain imbalance between the DC controlled I-channel signal I' and the DC controlled Q-channel signal Q' and generates a gain controlled Q-channel signal Q" by compensating the DC controlled Q-channel signal Q' according to the detected gain imbalance. The DC controlled I-channel signal I' is used for detecting the gain imbalance and passed to the phase imbalance compensator 1430 as a gain controlled I-channel signal I".

The gain imbalance compensator 1420 includes a first absolute value calculator 601 for calculating the first absolute value from the DC controlled I-channel signal; a second absolute value calculator 602 for calculating the second absolute value by obtaining an absolute value from the DC controlled Q-channel signal and changing a polarity of the obtained absolute value of the DC controlled Q-channel signal Q'; a first adder 603 for obtaining a gain imbalance signal by adding the first absolute value and the second absolute value; a second adder 604 for accumulating a value of the gain imbalance signal; a buffer 607 for storing the accumulated value of the gain imbalance signals as a loop filter output value; an ATC 604 for varying a loop filter gain by transferring a mode according to the accumulated value of the gain imbalance signal (loop filter output value); a variable gain controller 605 for dynamically amplifying the gain imbalance signal according to the loop filter gain from the ATC 604; and a multiplier 608 for compensating the DC controlled Q-channel signal according to the accumulated value of the gain imbalance signal.

There are three modes of compensating operation such as an initial mode, an acquisition mode and a trace mode. The initial mode is a mode performed in an initial time for the compensating operation. The ATC determines the mode of compensating operation according to a predetermined threshold and the accumulated imbalance. In the initial mode, a current imbalance is detected. The initial mode is transferred to acquisition mode for providing larger loop filter gain when the detected imbalance is exceeded over a predetermined threshold. By providing larger loop filter gain, a jitter performance may decrease but a desired frequency can be quickly traced. That is, a compensating operation is performed quickly. When the detected imbalance is below than the predetermined threshold, a mode is transferred to the trace mode for providing smaller loop filter gain. By providing smaller loop filter gain, the jitter performance is better than the acquisition mode so a compensating operation may be more accurate than the acquisition mode. However, the compensation operation takes more time than the acquisition mode.

Operations of the gain imbalance compensator 1420 are explained hereinafter.

The gain imbalance signal is generated by adding the first absolute value obtained from the DC controlled I-channel signal I' and the second absolute value obtained by changing a polarity of the absolute value of the DC controlled Q-channel signal Q'. A value of the gain imbalance signal is accumulated by forming a loop with the second adder 606 and the buffer 607. The accumulated value of the gain imbalance signals is the loop filter output value and the ATC 604 uses the loop filter output value for determining a type of mode. Also, the variable gain controller 605 controls the loop filter gain stored in a memory according to the determined mode.

Finally, the DC controlled Q-channel signal Q' is compensated by multiplying the accumulated value of the gain imbalance signals, which is amplified according to the loop filter gain at the variable gain controller 605, to the DC controlled Q-channel signal Q', and the gain controlled Q-channel signal Q" is outputted to the phase imbalance compensator 1430.

Figure 7:
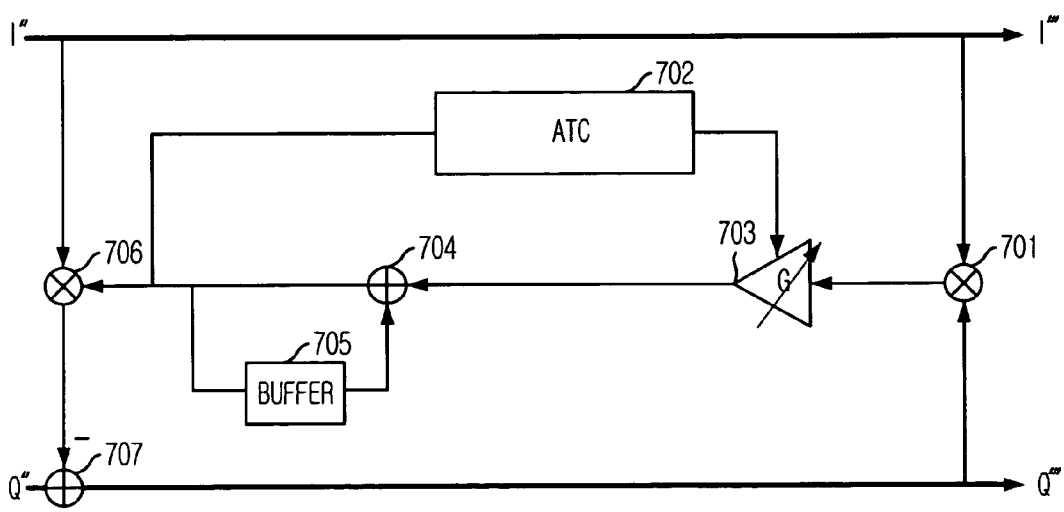
FIG. 7 is a diagram illustrating a phase imbalance compensator 1430 of a receiver 120 in FIG. 1 in accordance with a preferred embodiment of the present invention.

FIG. 7 is a diagram illustrating a phase imbalance compensator 1430 of a receiver 120 of FIG. 1 in accordance with a preferred embodiment of the present invention.

As shown, the phase imbalance compensator 1430 receives the gain controlled I-channel signal I" and the gain controlled Q-channel signal Q" from the gain imbalance compensator 1420 and detects a phase imbalance between the gain controlled I-channel signal I" and the gain controlled Q-channel signal Q". After detecting the phase imbalance, the phase imbalance compensator 1430 generates a phase controlled I-channel signal I'" and a phase controlled Q-channel signal Q'" by compensating the gain controlled Q-channel signal Q" according to the detected phase imbalance.

The phase imbalance compensator 1430 includes a first multiplier 701, a ATC 702, a variable gain controller 703, an adder 704, a buffer 705, a second multiplier 706 and a subtractor 707.

The first multiplier 701 multiples the gain controlled I-channel signal I" and the gain controlled Q-channel signal Q" to detect a phase imbalance between the gain controlled I-channel signal I" and the gain controlled Q-channel signal Q".

The adder 704 receives and accumulates the phase imbalance from the first multiplier 701.

The buffer 705 stores the accumulated phase imbalance from the adder 704.

The ATC 702 varies a loop filter gain of the variable gain controller 703 by transferring a mode according to the accumulated phase imbalance, which is a loop filter output value.

The variable gain controller 703 dynamically amplifies the phase imbalance according to the loop filter gain from the ATC 702.

The second multiplier 706 multiplies the accumulated phase imbalance and the gain controlled I-channel signal The subtractor 707 compensates the detected phase imbalance by subtracting the detected phase imbalance value from the gain detected Q-channel signal Q".

Compensating operations of the phase imbalance compensator 1430 is explained hereinafter.

A phase imbalance signal is generated by multiplying the gain controlled I-channel signal I" and the gain controlled Q-channel signal Q" at the first multiplier 701. A value of the phase imbalance signal is accumulated as a phase imbalance value by forming a loop filter with the adder 704 and the buffer 705. The accumulated phase imbalance value is a loop filter output value. Based on the accumulated phase imbalance value, the ATC 702 determines a mode of compensating operation and varies the loop filter gain of the variable gain controller 703 stored in a memory according to the determined mode. The variable gain controller 703 amplifies the detected phase imbalance signal according to the varied loop filter gain.

Finally, the gain controlled Q-channel signal Q" is compensated according to the accumulated value of the phase imbalance signal by adding to the accumulated value to the gain controlled Q-channel signal Q".

FIG. 8 is a flowchart showing operations for varying a loop filter gain in accordance with a preferred embodiment of the present invention.

As shown, a loop filter output value is stored in a memory such as a register at step S801. The loop filter value is generated by amplifying an imbalance signal according to a mode of a compensating operation.

It determines whether the loop filter output value is not "0" and is below than a predetermined threshold at step S802. If the loop filter output value is "0" or is larger than the predetermined threshold, a value of a counter sets to "0" at step S803 and the step S801 is repeatedly performed.

If the loop filter output value is not "0" and is below than the predetermined threshold, the value of the counter increase at step S804.

It determined whether the value of the counter is the predetermined threshold at step S805.

If the value is not the predetermined threshold, the step S801 is repeatedly performed.

If the value is the predetermined threshold, the loop filter gain is varied at step S806.

As mentioned above, a transmitter of the present invention detects DC offsets and imbalances between an I-channel signal and the Q-channel signal of a RF signal by using an average of data aided signals. And, the present invention compensates the detected DC offsets and imbalances by previously distorting the RF signal according to the detected DC offsets and the detected imbalances before generating the RF signal. Therefore, the present invention decreases distortion of the I-channel signal and the Q-channel signal, simplifies a structure of a circuitry when the present invention implements as the circuitry, detects and compensates the DC offset and the imbalances in real time and improves a speed of compensation.

Furthermore, the receiver of the present invention detects and compensates DC offsets and imbalances between the I-channel signal and the Q-channel signal of a received RF signal by using a loop filter gain which is automatically varied according to imbalance signal between the I-channel signal and the Q-channel signal. Therefore, the present invention improves an acquisition performance and reduces a jitter error for improve overall performance of the receiver.

The present invention contains subject matter related to Korean patent applications No. KR 2004-0050143, filed in the Korean patent office on Jun. 30, 2004, and Korean patent applications No. KR 2003-0097849, filed in the Korean patent office on Dec. 26, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An apparatus for compensating a direct current offset of a standard channel signal and a target channel signal in a quadrature receiving system, wherein the standard channel signal is selected by choosing one of an In-phase(I)-channel signal and a Quadrature-phase(Q)-channel signal and the target channel signal is selected by choosing another, the apparatus comprising:

means for detecting DC error signals in the standard channel signal and the target channel signal by obtaining two samples from the standard channel signal and the target channel signal, adding two samples to generate a sum and determining polarities of the standard channel signal and the target channel signal based on the sum; means for detecting DC offsets of the standard channel signal and the target channel signal by accumulating the DC error signals by forming a first loop with an adder and a buffer, determining a mode according to the accumulated DC error signals and varying a loop filter gain according to the determined mode; and means for compensating the standard channel signal by adding the DC offset to the standard channel signal and compensating the target channel signal by adding the DC offset to the target channel signal.

2. The apparatus of claim 1, wherein the DC error signal detecting means changes the mode by comparing a threshold of a counter generated according to the accumulated DC error signal to a predetermined value and dynamically changing the loop filter gain according to the mode.

3. The apparatus of claim 2, wherein the DC error signal detecting means includes:

means for adding the DC error signals in order to accumulate the DC error signals;

means for storing the accumulated DC error signals;

means for determining to change the mode according to the accumulated DC error signals in the storing means and varying the loop filter gain according to the accumulated DC error signals; and means for dynamically amplifying the DC error signals according to the loop filter gain and outputting the amplified DC error signal to the adding means.

4. An apparatus for compensating a gain imbalance between a standard channel signal and a target channel signal in a quadrature receiving system, wherein the standard channel signal is selected by choosing one of an In-phase(I)-channel signal and a Quadrature-phase(Q)-channel signal and the target channel signal is selected by choosing another, the apparatus comprising:

means for detecting a gain error signal by obtaining a first absolute value from the standard channel signal and a second absolute value from the target channel signal, and subtracting the second absolute value from the first absolute value;

means for detecting a gain imbalance between the standard channel signal and the target channel signal by accumulating the gain error signal by using a loop formed with an adder and a buffer, determining a type of a mode according to the accumulated gain error signal and changing a loop filter gain according to the determined type of mode; and means for compensating the target channel signal by multiplying the detected gain imbalance to the target channel signal.

5. The apparatus of claim 4, wherein the gain imbalance detecting means compares a predetermined value with a threshold of a counter, determining to change the type of mode according to the comparison result and dynamically changing the loop filter gain according to the type of mode.

6. The apparatus of claim 5, wherein the gain imbalance detecting means includes:

means for adding the gain error signal to accumulate the gain error signal;

means for storing the accumulated gain error signal;

means for determining to change the type of mode according to the accumulated gain error signal and changing the loop filter gain according to the type of mode; and means for dynamically amplifying the gain error signal according the loop filter gain and outputting the amplified gain error signal to the adding means.

7. An apparatus for compensating a phase imbalance between a standard channel signal and a target channel signal in a quadrature receiving system, wherein the standard channel signal is selected by choosing one of an In-phase(I-channel signal and a Quadrature-phase(Q)-channel signal and the target channel signal is selected by choosing another, the apparatus comprising:

means for detecting a phase error signal by multiplying the standard channel signal and the target channel signal;

means for detecting a phase imbalance between the standard channel signal and the target channel signal by accumulating the phase error signal by using a loop formed with an adder and a buffer, determining a type of mode according to the accumulated phase error signals and changing a loop filter gain according to the type of mode; and means for compensating the target channel signal by multiplying the detected phase imbalance to the standard channel signal and adding the multiplying result to the target channel signal.

8. The apparatus of claim 7, wherein the phase imbalance detecting means compares a predetermined value with a threshold of a counter, determining to change the type of mode according to the comparison result and dynamically changing the loop filter gain according to the type of mode.

9. The apparatus of claim 8, wherein the phase imbalance detecting means includes:

means for adding the imbalance error signal to accumulate the imbalance error signal;

means for storing the accumulated phase error signal;

means for determining to change the type of mode according to the accumulated phase error signal and changing the loop filter gain according to the type of mode; and means for dynamically amplifying the gain error signal according the loop filter gain and outputting the amplified gain error signal to the adding means.

10. An apparatus for compensating imbalances between a standard channel signal and a target channel signal in a quadrature receiving system, wherein the standard channel signal is selected by choosing one of an In-phase(I)-channel signal and a Quadrature-phase(Q)-channel signal and the target channel signal is selected by choosing another, the apparatus comprising:

means for compensating a gain imbalance by obtaining a gain error signal from the standard channel signal and the target channel signal, detecting a gain imbalance between the standard channel signal and the target channel signal by using a loop filter gain varied according to the obtained gain error signal and compensating the target channel signal based on the detected gain imbalance; and means for compensating a phase imbalance by obtaining a phase error signal from the standard channel signal and the target channel signal, detecting a phase imbalance between the standard channel signal and the target channel signal by using a loop filter gain varied according to the obtained phase error signal and compensating the target channel signal based on the detected phase imbalance.

11. The apparatus of claim 10, further comprising:

means for compensating DC offsets of the standard channel signal and the target channel signal by obtaining DC error signals from the standard channel signal and the target channel signal, detecting the DC offsets of the standard channel signal and the target channel signal by using a loop filter gain varied according to the obtained DC error signal and compensating the target channel signal and the standard channel signal based on the detected DC offsets.

12. The apparatus of claim 11, wherein the DC offset compensating means includes:

a DC offset detector for detecting DC offsets of the standard channel signal and the target channel signal by accumulating the DC error signals by using a loop formed with an adder and a buffer, determining a type of a mode according to the accumulated DC error signals and varying a loop filter gain according to the determined type of the mode; and a DC offset compensator for compensating the DC offset of the standard channel signal by adding the DC offset to the standard channel signal and compensating the DC offset of the target channel signal by adding the DC offset to the target channel signal.

13. The apparatus of claim 12, wherein the gain imbalance compensating means includes:

a gain error detector for detecting a gain error signal by obtaining a first absolute value from the standard channel signal and a second absolute value from the target channel signal, and subtracting the second absolute value from the first absolute value;

a gain imbalance detector for detecting a gain imbalance between the standard channel signal and the target channel signal by accumulating the gain error signal by using a loop formed with an adder and a buffer, determining a type of a mode according to the accumulated gain error signal and changing a loop filter gain according to the determined type of mode; and a gain imbalance compensator for compensating the target channel signal by multiplying the detected gain imbalance to the target channel signal.

14. The apparatus of claim 13, wherein the phase imbalance compensating means includes:

a phase error detector for detecting a phase error signal by multiplying the standard channel signal and the target channel signal;

a phase imbalance detector for detecting a phase imbalance between the standard channel signal and the target channel signal by accumulating the phase error signal by using a loop formed with an adder and a buffer, determining a type of mode according to the accumulated phase error signals and changing a loop filter gain according to the type of mode; and a phase imbalance compensator for compensating the target channel signal by multiplying the detected phase imbalance to the standard channel signal and adding the multiplying result to the target channel signal.

* * * * *